(12) United States Patent
Ryu et al.

(10) Patent No.: US 8,610,130 B2
(45) Date of Patent: Dec. 17, 2013

(54) MONOLITHIC HIGH VOLTAGE SWITCHING DEVICES

(75) Inventors: Sei-Hyung Ryu, Cary, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 684 days.

(21) Appl. No.: 12/609,406

(22) Filed: Oct. 30, 2009

(65) Prior Publication Data
US 2011/0101374 A1    May 5, 2011

(51) Int. Cl.
*H01L 29/15* (2006.01)
(52) U.S. Cl.
USPC ............................ 257/77; 257/192; 257/341
(58) Field of Classification Search
USPC .......................................... 257/77, 192, 341
See application file for complete search history.

(56) References Cited

U.S. PATENT DOCUMENTS 8,080,826 B1 * 12/2011 Johnson et al. .................. 257/77
2011/0084284 A1 * 4/2011 Zhang et al. ..................... 257/77

OTHER PUBLICATIONS

Hull et al., "Drift-Free 10-kV, 20-A 4H-SiC PiN Diodes," Journal of Electronic Materials, vol. 34, No. 4, 2005, pp. 341-344.
Buchner et al., "Laser Recrystallization of Polysilicon for Improved Device Quality," Springer Proceedings in Physics, vol. 35, Polycrystalline Semiconductors, pp. 289-294, 1989.

* cited by examiner

*Primary Examiner* — Mark Prenty
(74) *Attorney, Agent, or Firm* — Myers Bigel Sibley & Sajovec

(57) ABSTRACT

Metal oxide semiconductor (MOS) power devices are provided including a MOS channel including a semiconductor material having high electron mobility on a silicon carbide (SiC) layer. Related methods are also provided herein.

16 Claims, 6 Drawing Sheets

US 8,610,130 B2

MONOLITHIC HIGH VOLTAGE SWITCHING DEVICES

FIELD

The present invention relates to electronic devices and, more particularly, to high voltage transistors.

BACKGROUND

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications.

SiC DMOSFET devices with a 10 kV blocking capability have been fabricated with a specific on-resistance of about 100 mΩ×cm². DMOSFET devices may exhibit very fast switching speed of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, *Drift-Free 10-kV, 20-A 4H-SiC PiN Diodes*, Journal of Electrical Materials, Vol. 34, No. 4, 2005. These developments may enhance the development and/or potential applications of SiC bipolar devices such as thyristors, GTOs. etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4H—SiC insulated gate bipolar transistors (IGBTs) are becoming more suitable for power switching applications.

SUMMARY

Some embodiments of the present invention provide metal oxide semiconductor (MOS) power devices including a MOS channel including a semiconductor material having high electron mobility on a silicon carbide (SiC) layer.

In further embodiments of the present invention, the semiconductor material having high electron mobility may include at least one of silicon, germanium, gallium arsenide and gallium nitride and the SiC layer may include at least one of a silicon carbide substrate, an implanted SiC layer and a SiC epitaxial layer.

In still further embodiments of the present invention, the device may be a unipolar device or a bipolar device.

In some embodiments of the present invention, the SiC layer of the bipolar device may include a p-type SiC layer and be an anode of the SiC bipolar device.

In further embodiments of the present invention, the device may further include an n⁻ SiC layer on the p-type SiC layer and an n⁺ SiC layer on the n⁻ SiC layer. The n⁺ SiC layer may have a carrier concentration that is higher than the carrier concentration of the n⁻SiC layer.

In still further embodiments of the present invention, the n⁻ SiC layer may have a thickness of from about 5.0 μm to about 200 μm and a carrier concentration of about $1.0 \times 10^{13}$ cm⁻³ to about $1.0 \times 10^{16}$ cm⁻³.

In some embodiments of the present invention, the n⁺ SiC layer may have a thickness of about 2000 Å, a carrier concentration of greater than about $1.0 \times 10^{18}$ cm⁻³ and may be a cathode of the SiC bipolar device.

In further embodiments of the present invention, the device may further include p-type SiC well regions in the n− SiC layer. The p-type SiC well regions may have a doping concentration of from about $1.0 \times 10^{18}$ cm⁻³ to about $5.0 \times 10^{20}$ cm⁻³ and serve as an emitter for the bipolar SiC device.

In still further embodiments of the present invention, the p-type SiC well regions may extend from about 0.1 μm to about 2.0 μm into the n⁻ SiC layer.

In some embodiments of the present invention, the device may further include a dielectric layer on the p-type well regions and a semiconductor layer on the dielectric layer on the p-type well regions. The semiconductor layer may include the semiconductor material having high electron mobility. The semiconductor layer may include n⁺ doped portions to provide source/emitter regions and n⁻ doped portions to provide voltage absorbing regions. Source/emitter contacts may be provided on the n⁺ doped portions.

In further embodiments of the present invention, the device may further include a collector contact on a surface of the p-type SiC layer opposite the n⁻ SiC layer.

In still further embodiments of the present invention, the device may withhold a gate pinch-off voltage of about 40 V.

In some embodiments of the present invention, the SiC layer of the unipolar device may be an n-type SiC layer.

In further embodiments of the present invention, the device may further include an n⁻ SiC layer on the n-type SiC layer and an n⁺ SiC layer on the n⁻ SiC layer. The n⁺ SiC layer may have a carrier concentration that is higher than the carrier concentration of the n⁻ SiC layer.

In still further embodiments of the present invention, the n⁻ SiC layer may have a thickness of about 5.0 μm to about 200 μm and a carrier concentration of about $1.0 \times 10^{14}$ cm⁻³ to about $1.0 \times 10^{17}$ cm⁻³.

In some embodiments of the present invention, the n⁺ SiC layer may have a thickness of from about 0.05 μm to about 200 μm and a carrier concentration of greater than about $1.0 \times 10^{18}$ cm⁻³.

In further embodiments of the present invention, the device may further include p-type SiC well regions in the n⁻ SiC layer. The p-type SiC well regions may have a doping concentration of from about $1.0 \times 10^{18}$ cm⁻³ to about $5.0 \times 10^{20}$ cm⁻³.

In still further embodiments of the present invention, the p-type SiC well regions may extend from about 0.1 μm to about 2.0 μm into the n⁻ SiC layer.

In some embodiments of the present invention, the device may further include a dielectric layer on the p-type well regions and a semiconductor layer on the dielectric layer on the p-type well regions. The semiconductor layer may include the semiconductor material having high electron mobility. The semiconductor layer may include n⁺ doped portions to provide source regions and n⁻ doped portions to provide voltage absorbing regions. Source contacts may be provided on the n⁺ doped portions.

In further embodiments of the present invention, a drain contact may be provided on a surface of the n-type SiC layer opposite the n⁻ SiC layer.

Although embodiments of the present invention are discussed above primarily with respect to device embodiments, methods of fabricating devices are also provided herein.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
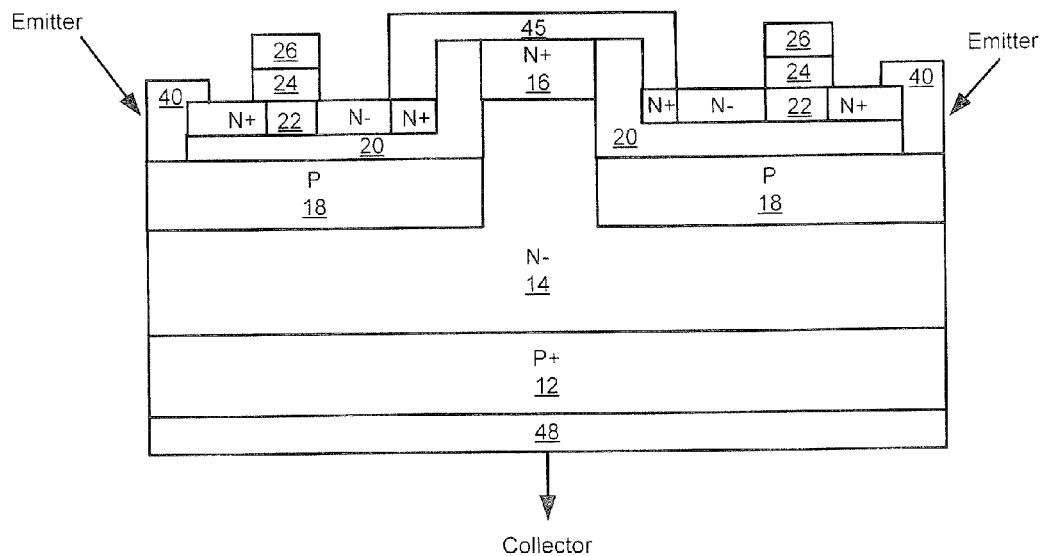
FIG. 1 is a cross-section of a bipolar metal oxide semiconductor (MOS) power device according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items. Furthermore, as used herein "at least one of" of listing of items includes one or more of the items listed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n⁺, n⁻, p⁺, p⁻, n⁺⁺, n⁻⁻, p⁺⁺, p⁻⁻, or the like), to indicate a relatively larger ("+") or smaller ("−") concentration of majority carriers compared to another layer or region. However, such notation does not imply the existence of a particular concentration of majority or minority carriers in a layer or region.

Furthermore, although at layer may be described herein as having semiconductor layers and/or regions which are characterized as having a conductivity type such as n-type or p-type, it will be understood that in some embodiments these conductivity types may be interchanged without departing from the scope of the present invention. For example, the p-type layers/regions may be replaced with n-type layers/regions and the n-type layers/regions may be replaced with p-type layers/regions without changing the functionality of the device.

Conventional silicon carbide (SiC) devices, for example, insulated gate bipolar transistors (IGBTs), may provide relatively low metal-oxide-silicon (MOS) channel mobility, which typically leads to high on-resistance in a unipolar device and double sided injection in the drift layer of a bipolar device. Thus, according to some embodiments of the present invention, a high mobility MOS channel is provided for the control gate of the device, which reduces and possibly alleviates the problem of low channel mobility of SiC MOS devices. Furthermore, in biopolar devices, a highly efficient cathode and anode are provided for the drift layer. Thus, SiC unipolar devices in accordance with some embodiments of the present invention may not have an $SiO_2$—SiC interface that supports high electron field, which may help improve the reliability and specific on-resistance. SiC bipolar devices in accordance with some embodiments of the present invention may have low specific on-resistance and may be immune from a latch up problem as will be discussed further below with respect to FIGS. 1 through 3G.

Although embodiments of the present invention are discussed with respect to IGBTs, it will be understood that embodiments of the present invention are not limited to this configuration. Embodiments of the present invention may be in combination with any device that may benefit from the teachings thereof.

A bipolar metal oxide semiconductor (MOS) power device structure according to some embodiments of the invention is illustrated in FIG. 1. As illustrated in FIG. 1, an n− silicon carbide (SiC) layer 14 is provided on a p-type injecting layer 12. The p-type injecting layer 12 may be, for example, a p+ silicon carbide substrate or a p+ silicon carbide layer formed by epitaxial growth or ion implantation. As is known to those of skill in the art, doped regions/layers of SiC may be formed through epitaxial growth and/or through implantation. For example, a p-type injecting layer 12 may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions of silicon carbide.

Although embodiments of the present invention are discussed wherein the injecting layer 12 includes SiC, embodiments of the present invention may not be limited to this configuration. For example, other semiconductor materials having a "high breakdown field" may be used without departing from the scope of the present invention. As used herein, semiconductor materials having "a high breakdown field" refer to semiconductor materials having a breakdown electric field higher than about 2.0 MV/cm.

The p-type injecting layer 12 may serve as an anode of the SiC bipolar MOS power device. As further illustrated in FIG. 1, an n+SiC layer 16 is provided on the n− SiC layer 14. The n+ SiC layer 16 has a carrier concentration that is higher than the carrier concentration of the n− SiC layer 14. In some embodiments, the n− SiC layer 14 has a thickness of from about 5.0 μm to about 200 μm and a carrier concentration of from about $1.0\times10^{13}$ cm$^{-3}$ to about $1.0\times10^{16}$ cm$^{-3}$. The n+ SiC layer 16 has thickness of from about 0.05 μm to about 1.0 μm, a carrier concentration of greater than about $1.0\times10^{18}$ cm$^{-3}$. The n+ SiC layer 16 may be the cathode of the SiC bipolar device.

As further illustrated in the FIG. 1, the device further includes p-type SiC well regions 18 in the n− SiC layer 14. The p-type SiC well regions 18 may have a doping concentration of from about $1.0\times10^{18}$ cm$^{-18}$ to about $5.0\times10^{20}$ cm$^{-3}$ and may be the emitter/cathode for the bipolar device. The p-type SiC well regions 18 extend from about 0.1 μm to about 2.0 μm into the n− SiC layer 14.

A dielectric layer 20, for example, an oxide is provided on the p-type well regions 18. A semiconductor material having a high electron mobility 22 may be provided on the dielectric layer. As used herein, a semiconductor material having a "high electron mobility" refers to a semiconductor material having an electron mobility of greater than about 1500 cm$^2$/Vs. The semiconductor material 22 may include, for example, silicon, germanium, gallium nitride and/or gallium arsenide. In embodiments where the semiconductor layer 22 is a silicon layer, the silicon layer may be a poly or amorphous silicon layer having a thickness of from about 0.1 μm to about 2.0 μm. The semiconductor layer (silicon layer) 22 is recrystallized at a high temperature, for example, of about 900° C. to about 2000° C., to improve the electrical characteristics of the MOS device. Details of this process is discussed in *Laser Recrystallization of Polysilicon for Improved Device Quality* to Buchner et al. (Springer Proceedings in Physics, Vol. 35 (1989), the content of which is hereby incorporated herein by reference as if set forth herein in its entirety.

Figure 1A:
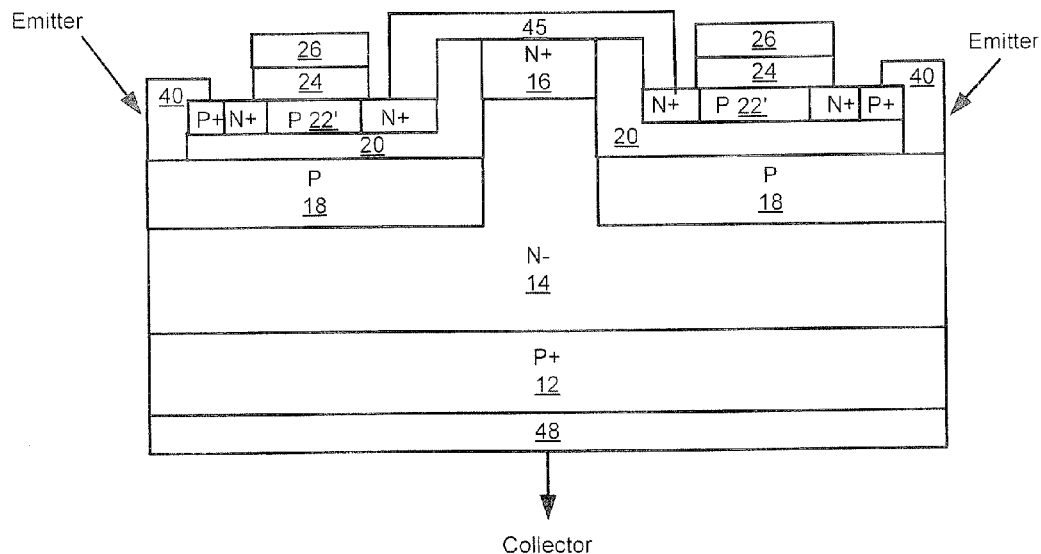
FIG. 1A is a cross-section of a metal oxide semiconductor (MOS) power device according to some embodiments of the invention.

As further illustrated in FIG. 1, the semiconductor layer 22 includes n+ doped portions to provide source regions and n− doped portions to provide voltage absorbing regions. Referring to FIG. 1A, in some embodiments of the present invention, layer 22' may be p-type and have n+ and p+ regions as illustrated therein without departing from the scope of the present invention.

Referring again to FIG. 1, Gate dielectric 24 and gate electrodes 26 are provided on the recrystalized semiconductor layer 22. The gate dielectric 24 may be, for example, heavily doped or metal without departing from the scope of the present invention. Metal is provided to form electrodes to the semiconductor layer 22 for emitter contacts 40, to silicon carbide device for the collector contact 48 and connects the two 45. The device of FIG. 1 in accordance with some embodiments of the present invention may withhold a gate pinch-off voltage of about 40 V.

Figure 2:
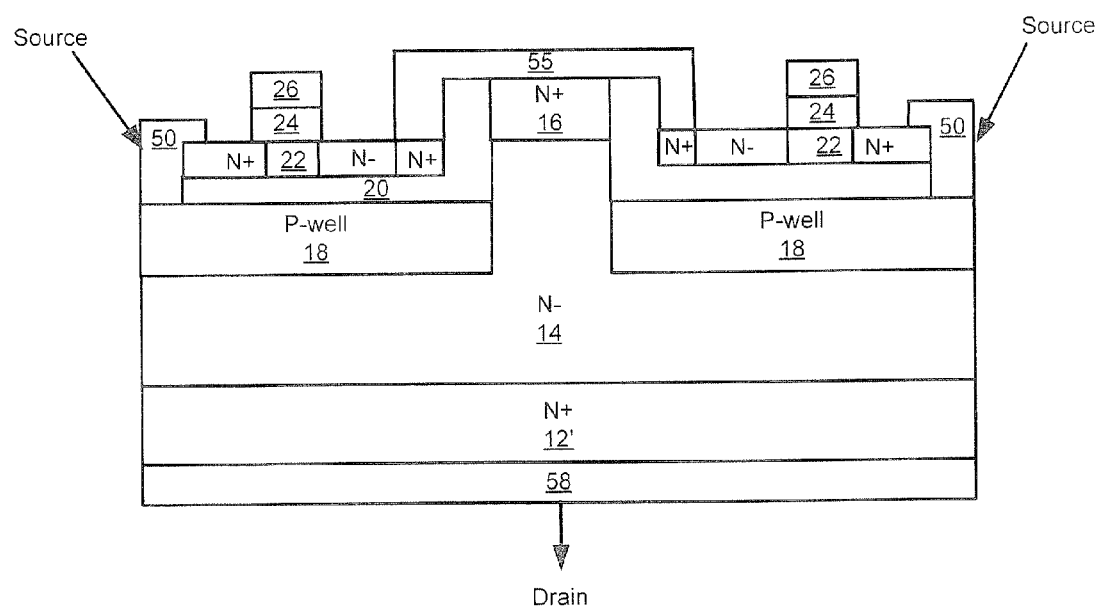
FIG. 2 is a cross-section of a unipolar MOS power device according to some embodiments of the invention.

Referring now to FIG. 2, a unipolar MOS power device may be provided by replacing the p-type SiC layer with an n-type SiC Layer 12'. The n-type silicon carbide layer may have a thickness of from about 0.5 μm to about 400 μm and a doping concentration of from $1.0\times10^{17}$ cm$^{-3}$ to about $1.0\times10^{21}$ cm$^{-3}$. As illustrated in FIG. 2, source contacts 50, a drain contact 58 and connecting contact 55 are provided in place of the emitter contacts 40, the collector contact 48 and connecting contact 45, respectively, of FIG. 1.

In a unipolar device, the n− SiC layer may have a thickness of from about 5.0 μm to about 200 μm and a carrier concentration of from about $5.0\times10^{14}$ cm$^{-3}$ to about $1.0\times10^{17}$ cm$^{-3}$. Furthermore, the n+SiC layer 16 may have a thickness of from about 0.05 μm to about 1.0 μm and a carrier concentration of greater than about $1.0\times10^{18}$ cm$^{-3}$.

As discussed briefly above with respect to FIGS. 1 and 2, some embodiments of the present invention provide a high mobility MOS channel for the control gate of the MOS power device, which may reduce or possibly alleviate the problem of low channel mobility of conventional SiC MOS devices. Furthermore, in biopolar devices illustrated in FIG. 1, a highly efficient cathode and anode are provided for the drift layer. SiC bipolar devices in accordance with some embodiments of the present invention may have low specific on-resistance and may be less like to suffer from latch up problem. SiC unipolar devices illustrated in FIG. 2 in accordance with some embodiments of the present invention may not have an $SiO_2$—SiC interface that supports high electron field, which may help improve the reliability and specific on-resistance.

Operations of the MOS power devices discussed above with respect to FIGS. 1 and 2 will now be discussed. In the on-state, a positive bias beyond the threshold voltage is applied to the gate of the silicon metal oxide semiconductor field effect transistor (MOSFET), and a positive bias is applied to the drain (or collector) of the SiC high voltage device. The gate of the high voltage SiC transistor is grounded, and the potential of the source (or cathode) of the high voltage SiC transistor is close to the ground, opening up the channel between the two adjacent $p^+$ gates. Electrons flow from the source (cathode) of the silicon MOSFET, into the drain (collector) of the silicon MOSFET, which is connected to the source (or cathode) of the high voltage SiC transistor. Electrons then flow through the JFET region, into the drift layer, then into the drain. For the bipolar version of the structure, holes are injected from the collector of the structure, providing conductivity modulation of the drift layer. The excess holes and electrons recombine and disappear in the drift layer.

In the off-state, the gate bias of the silicon MOSFET is lowered below the threshold voltage, shutting off the electron supply, while the gate of the high voltage SiC transistor is grounded. Since the source (or cathode) of the high voltage transistor is practically disconnected from the source, it will float up in potential with the drain (or anode, for a bipolar device). This creates a negative gate-to-source bias. When the gate-to-source bias becomes sufficiently negative, the high voltage SiC transistor turns itself off. At this time, the integrated silicon MOSFET must be able to support the gate-to-source bias, which be around 40V.

Some embodiments of the present invention will not experience the parasitic inductances that a cascade connected circuit may because the circuit is made with discrete parts (off-chip), i.e. a cascade connection of a normally-on SiC transistor and a silicon MOSFET. For a bipolar version of this device, the integrated silicon MOSFET in this structure works as a distributed internal ballast, which reduces the likelihood that individual cells in the SiC bipolar device. This feature may reduce the likelihood of local thermal runaways that may occur due to non-uniform distribution of lifetime and carrier mobility within the drift-region of the SiC bipolar switch fabricated with current technology.

For the bipolar version of the device, this device will be less likely to experience or possibly be immune from the latch up problems that a traditional IGBT may experience, since bipolar devices according to some embodiments of the present invention lack the vertical npnp structure of the IGBT.

Figure 3A:
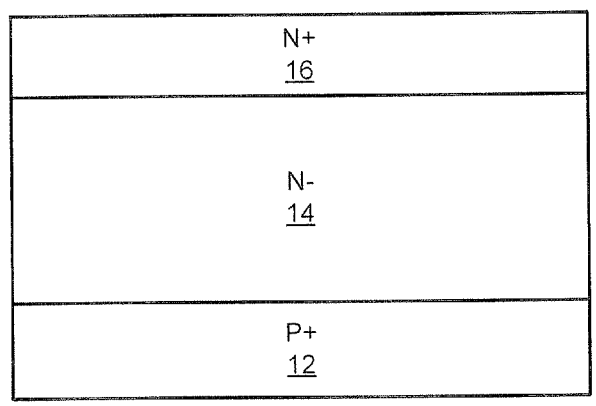
FIGS. 3A through 3G are cross-section illustrations showing intermediate structures in the formation of MOS power devices according to some embodiments of the invention.

Referring now to FIGS. 3A through 3G, cross sections illustrating the fabrication of a bipolar MOS power device in accordance with some embodiments of the present invention will be discussed. As illustrated in FIG. 3A, an $n^-$ silicon carbide (SiC) layer 14 is formed, for example, by epitaxial growth, on a p-type injecting layer 12. The p-type injecting layer 12 may be, for example, a $p^+$ silicon carbide substrate or a $p^+$ silicon carbide layer formed by epitaxial growth or ion implantation. As is known to those of skill in the art, doped regions/layers of SiC may be formed through epitaxial growth and/or through implantation. For example, a p-type injecting layer 12 may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions of silicon carbide.

The p-type injecting layer 12 may serve as an anode of the SiC bipolar MOS power device. The p-type injecting layer 12 may have a thickness of from about 0.5 μm to about 100 μm and a carrier concentration of from about $1.0 \times 10^{17}$ $cm^{-3}$ to about $1.0 \times 10^{21}$ $cm^{-3}$. As further illustrated in FIG. 3A, an SiC layer 16 is formed, for example, by epitaxial growth, on the $n^-$ SiC layer 14. The $n^+$ SiC layer 16 has a carrier concentration that is higher than the carrier concentration of the $n^-$ SiC layer 14. In some embodiments, the $n^-$ SiC layer 14 has a thickness of from about 5.0 μm to about 200 μm and a carrier concentration of from about $1.0 \times 10^{13}$ $cm^{-3}$ to about $1.0 \times 10^{17}$ $cm^{-3}$. The $n^+$ SiC layer 16 has thickness of from about 0.05 μm to about 1.0 μm, a carrier concentration of greater than about $1.0 \times 10^{18}$ $cm^{-3}$. The $n^+$ SiC layer 16 may serve as the cathode of the SiC bipolar device.

Figure 3B:
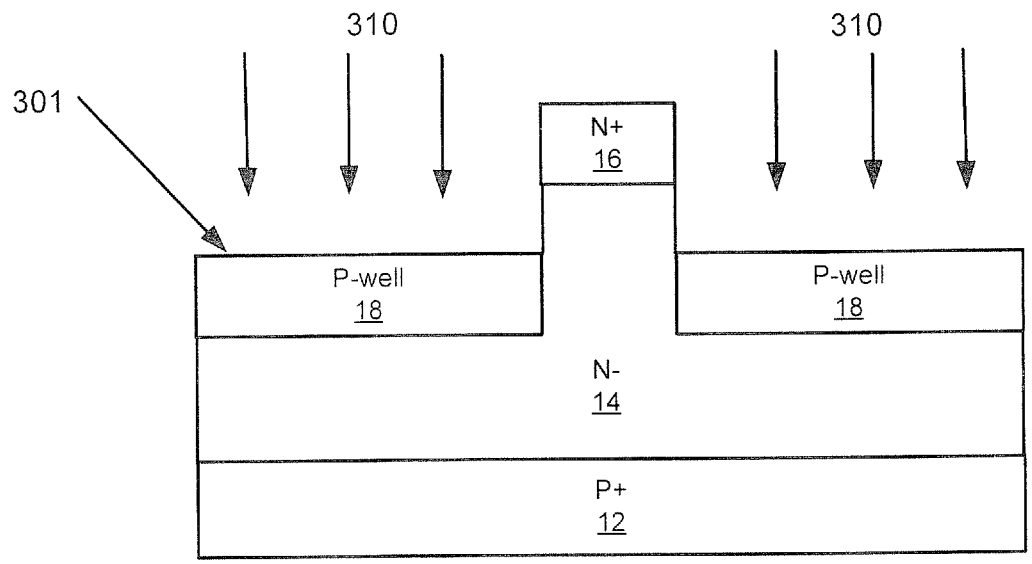

Referring now to FIG. 3B, the $n^-$ SiC layer 14 and the $n^+$ SiC layer 16 are patterned and etched according to a mask to provide trenches 301 in the $n^-$ SiC layer 14. The trenches 301 extend from about 0.5 μm to about 3.0 μm into the $n^-$ SiC layer 14. P-type ions 310, such as aluminum or boron, are implanted into the bottom of the trenches 301 to provide p-type SiC well regions 18 in the $n-$ SiC layer 14. The p-type SiC well regions 18 may have a doping concentration of about $1.0 \times 10^{20}$ $cm^{-3}$ and may serve as the emitter/cathode for the bipolar device. The p-type SiC well regions 18 extend from about 0.1 μm to about 2.0 μm into the $n^-$SiC layer 14. The device of FIG. 3B may serve as a field-controlled-thyristor, with both a $p^+$ anode and $n^+$ cathode injecting carriers in the on-state contributing to conductivity modulation of the drift layer.

Figure 3C:
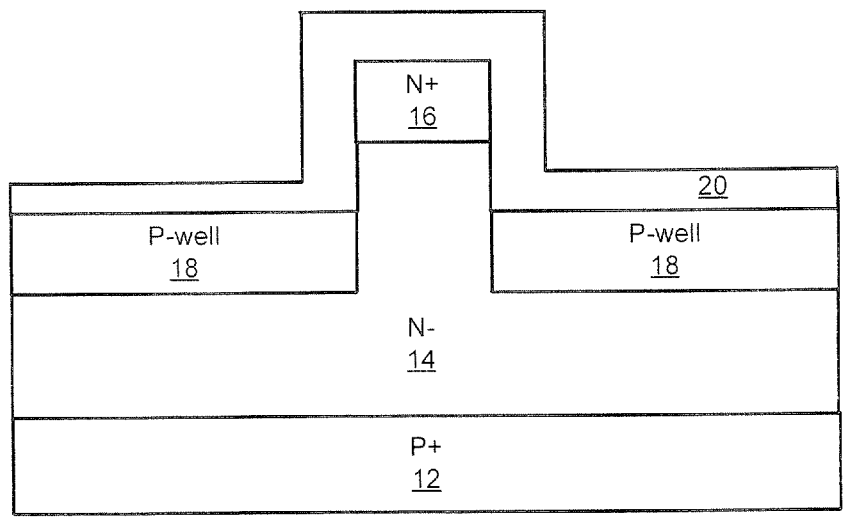
Figure 3D:
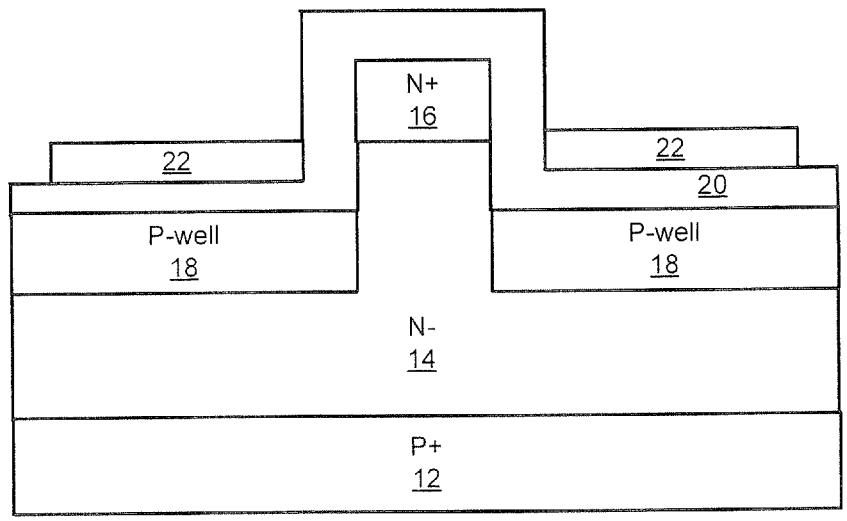

Referring now to FIG. 3C, a dielectric layer 20, for example, an oxide, is deposited on the surface of the device including the p-type well regions 18. As further illustrated in FIG. 3D, a semiconductor material having a high electron mobility 22 is formed on the dielectric layer. The semiconductor material 22 may include, for example, silicon, germanium, gallium nitride and/or gallium arsenide. In embodiments where the semiconductor layer 22 is a silicon layer, a poly or amorphous silicon layer is formed on the dielectric layer 20. The semiconductor layer (silicon layer) 22 is patterned and etched according to a mask (not shown). The semiconductor layer 22 has a thickness of from about 0.1 μm to about 2.0 μm. The semiconductor layer 22 is recrystalized at a high temperature, for example, of from about 900° C. to about 2000° C., to improve the electrical characteristics of the MOS power device. Details of this process are discussed in *Laser Recrystallization of Polysilicon for Improved Device Quality* to Buchner et al. (Springer Proceedings in Physics, Vol. 35 (1989), the content of which is hereby incorporated herein by reference as if set forth herein in its entirety.

Figure 3E:
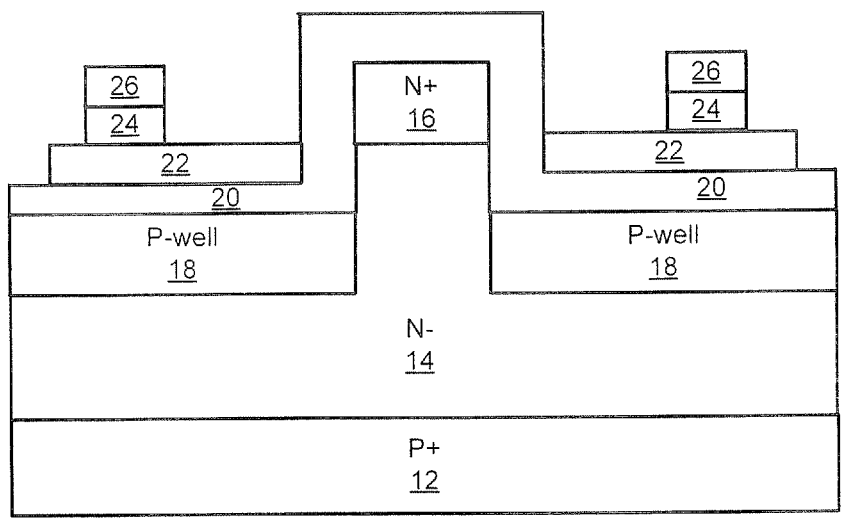

Referring now to FIG. 3E, a gate dielectric layer is formed by, for example, thermal oxidation or deposition. The gate dielectric layer is patterned an etched to form gate dielectrics 24. Heavily doped polysilicon or metal may be deposited and patterned to provide the gate electrodes 26 on the gate dielectrics 24.

Figure 3F:
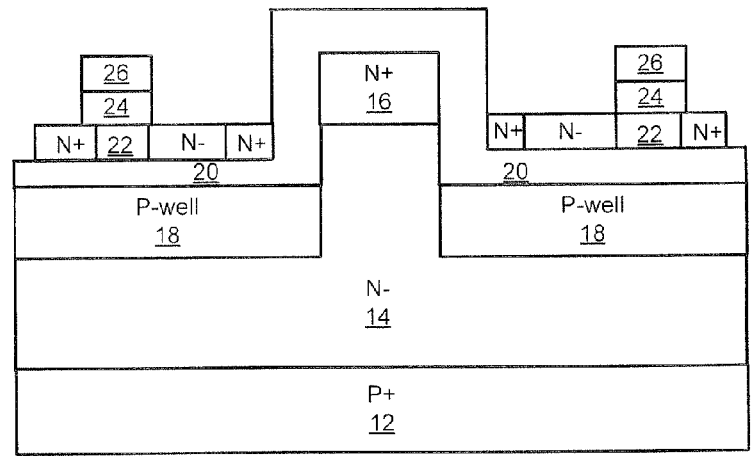
Figure 3G:
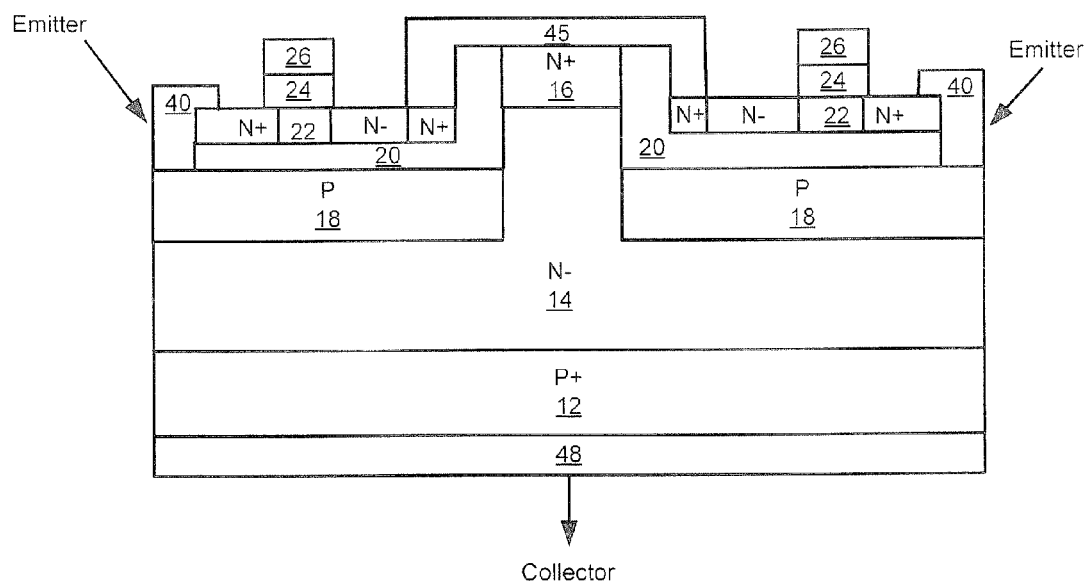

As illustrated in FIG. 3F, the semiconductor layer 22 is doped for source/drain regions and voltage absorbing regions. In particular, the $n^+$ doped portions of the semiconductor layer 22 provide source regions and the $n^-$ doped portions of the semiconductor layer 22 provide the voltage absorbing regions. Finally, as illustrated in FIG. 3G, metal is deposited to form electrodes to the silicon 40 and silicon carbide device 48 and to connect the two 45. The device of FIG. 3E in accordance with some embodiments of the present invention may withhold a gate pinch-off voltage of about 40 V.

Although not illustrated in FIGS. 3A-3G, a unipolar device may be provided by replacing the p-type injecting layer with an n-type layer 12' as illustrated in FIG. 2 discussed above. However, in a unipolar device, the n-type silicon carbide layer 12' may have a thickness of from about 0.5 μm to about 400 μm and a doping concentration of from about $1.0 \times 10^{17}$ cm$^{-3}$ to about $1.0 \times 10^{21}$ cm$^{-3}$. Source contacts 50, a drain contact 58 and connecting contact 55 are provided in place of the emitter contacts 40, the collector contact 48 and connecting contact 45 of the bipolar device of FIG. 3G. Furthermore, in a unipolar device, the n$^-$ SiC layer may have a thickness of from about 5.0 μm to about 200 μm and a carrier concentration of from about $5.0 \times 10^{14}$ cm$^{-3}$ to about $1.0 \times 10^{17}$ cm$^{-3}$. Furthermore, the n$^+$ SiC layer may have a thickness of from about 0.05 μm to about 1.0 μm and a carrier concentration of greater than about $1.0 \times 10^{18}$ cm$^{-3}$.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A metal oxide semiconductor (MOS) power device, comprising:
   a MOS channel including a semiconductor material having high electron mobility on a p-type silicon carbide (SiC) layer,
   wherein the device comprises a bipolar device; and
   wherein the p-type SiC layer is an anode of the SiC bipolar device; and
   an n$^-$ SiC layer on the p-type SiC layer, wherein the n$^-$ SiC layer has a thickness of from about 5.0 μm to about 200 μm and a carrier concentration of from about $1.0 \times 10^{13}$cm$^{-3}$ to about $1.0 \times 10^{16}$cm$^{-3}$.

2. The MOS power device of claim 1, wherein the semiconductor material having high electron mobility comprises at least one of silicon, germanium, gallium arsenide and gallium nitride and wherein the SiC layer comprises at least one of a silicon carbide substrate, an implanted SiC layer and a SiC epitaxial layer.

3. The MOS power device of claim 1, further comprising:
   an n$^+$ SiC layer on the n$^-$ SiC layer, the n$^+$ SiC layer having a carrier concentration that is higher than the carrier concentration of the n$^-$ SiC layer.

4. The MOS power device of claim 3, wherein the n$^+$ SiC layer has thickness of about 2000 Å, a carrier concentration of greater than about $1.0 \times 10^{18}$cm$^{-3}$ and is a cathode of the SiC bipolar device.

5. The MOS power device of claim 3, further comprising:
   p-type SiC well regions in the n– SiC layer, the p-type SiC well regions having a doping concentration of from about $1.0 \times 10^{18}$cm$^{-3}$ to about $5.0 \times 10^{20}$cm$^{-3}$ and serving as an emitter for the bipolar SiC device.

6. The MOS power device of claim 5, wherein the p-type SiC well regions extend from about 0.1 μm to about 2.0 μm into the n$^-$ SiC layer.

7. The MOS power device of claim 6, further comprising:
   a dielectric layer on the p-type well regions;
   a semiconductor layer on the dielectric layer on the p-type well regions and including the semiconductor material having high electron mobility, the semiconductor layer including n$^+$ doped portions to provide source regions and n$^-$ doped portions to provide voltage absorbing regions; and
   emitter contacts on the n$^+$ doped portions, 8. The MOS power device of claim 7, further comprising a collector contact on a surface of the p-type SiC layer opposite the n$^-$ SiC layer.

9. The MOS power device of claim 8, wherein the device withholds a gate pinch-off voltage of about 40 V.

10. A metal oxide semiconductor (MOS) power device, comprising:
    a MOS channel including a semiconductor material having high electron mobility on an n-type silicon carbide (SiC) layer, wherein the device comprises a unipolar device;
    an n$^-$ SiC layer on the n-type SiC layer; and
    an n$^+$ SiC layer on the n$^-$ SiC layer, the n$^+$ SiC layer having a carrier concentration that is higher than the carrier concentration of the n$^-$ SiC layer,
    wherein the n$^-$ SiC layer has a thickness of from about 5.0 μm to about 200 μm and a carrier concentration of from about $5.0 \times 10^{14}$cm$^{-3}$ to about $1.0 \times 10^{17}$cm$^{-3}$.

11. The MOS power device of claim 10, wherein the n$^+$ SiC layer has thickness of from about 0.05 μm to about 1.0 μm and a carrier concentration of greater than about $1.0 \times 10^{18}$cm$^{-3}$.

12. The MOS power device of claim 10, further comprising:
    p-type SiC well regions in the n$^-$ SiC layer, the p-type SiC well regions having a doping concentration of from about $1.0 \times 10^{18}$cm$^{-3}$ to about $5.0 \times 10^{20}$cm$^{-3}$.

13. The MOS power device of claim 12, wherein the p-type SiC well regions extend from about 0.1 μm to about 2.0 μm into the n$^-$ SiC layer.

14. The MOS power device of claim 12, further comprising:
    a dielectric layer on the p-type well regions;
    a semiconductor layer on the dielectric layer on the p-type well regions and including the semiconductor material having high electron mobility, the semiconductor layer including n$^+$ doped portions to provide source regions and n$^-$ doped portions to provide voltage absorbing regions; and
    source contacts on the n$^+$ doped portions.

15. The MOS power device of claim 14, further comprising a drain contact on a surface of the n-type SiC layer opposite the n$^-$ SiC layer.

16. The MOS power device of claim 10, wherein the semiconductor material having high electron mobility comprises at least one of silicon, germanium, gallium arsenide and gallium nitride and wherein the n-type SiC layer comprises at least one of a silicon carbide substrate, an implanted SiC layer and a SiC epitaxial layer.

\* \* \* \* \*

UNITED STATES PATENT AND TRADEMARK OFFICE
CERTIFICATE OF CORRECTION

PATENT NO. : 8,610,130 B2  Page 1 of 1
APPLICATION NO. : 12/609406
DATED : December 17, 2013
INVENTOR(S) : Ryu et al.

It is certified that error appears in the above-identified patent and that said Letters Patent is hereby corrected as shown below:

In the Specifications:
Column 6, Line 7, Title: Please correct "about $1.0 \times 10^{18}$ cm$^{-18}$ to about"
to read -- about $1.0 \times 10^{18}$ cm$^{-3}$ to about --

Column 8, Line 11: please correct "in FIG. 3A, an SiC"
to read -- in FIG. 3A, an n$^{+}$ SiC --

In the Claims:
Column 10, Claim 7, Line 12: Please correct "doped portions,"
to read -- doped portions. --

Signed and Sealed this
Twenty-ninth Day of April, 2014

Michelle K. Lee
*Deputy Director of the United States Patent and Trademark Office*